THERMOELECTRIC COOLING DEVICE

Filed Jan. 14, 1960

WITNESSES

Edwin E. Bassler

Charles L. Menzemer

INVENTORS
Robert S. Lackey &
Jack D. Meess
BY
Frederick Shapoe
ATTORNEY 2,994,203
THERMOELECTRIC COOLING DEVICE
Robert S. Lackey, Pittsburgh, and Jack D. Meess, Export, Pa., assignors to Westinghouse Electric Corporation, East Pittsburgh, Pa., a corporation of Pennsylvania
Filed Jan. 14, 1960, Ser. No. 2,533
17 Claims. (Cl. 62—3)

This invention relates generally to a thermoelectric cooling device and more particularly to a thermoelectric device capable of supporting and effectively cooling an electrical component.

An object of the present invention is to provide a thermoelectric cooling device capable of supporting in a spaced, projected position an electrical component and effectively cooling the electrical component which is adversely affected by heat, the electrical component being supported in such a manner and being so accessible that electrical leads or contacts can be readily affixed to desired portions thereof.

Another object of the present invention is to provide a thermoelectric cooling device capable of supporting in a spaced projected position and effectively cooling an electrical component, the thermoelectric device comprising a base plate having one surface in contact with the cold junction of at least one pair of thermoelectric elements, and a metallic member projecting vertically from the opposite surface of the base member, the projecting metallic member being capable of supporting the electrical component in a readily accessible position and serving to effectively carry heat from said electrical component to the cold junction through the base plate.

Other objects of the present invention will, in part, appear hereinafter, and will, in part, be obvious.

For a better understanding of the nature and objects of the invention, reference should be had to the following detailed description and drawings in which.

In accordance with the present invention, and in attainment of the foregoing objects there is provided a thermoelectric cooling device capable of supporting in a spaced projected position and effectively cooling an electrical component which is adversely affected by heat, comprising, a base plate, said base plate being comprised of a metal having a high thermal conductivity, at least one pair of thermoelectric elements having the cold junction in thermal conductive contact with one surface of said base plate, said thermoelectric elements being electrically insulated from said base plate, a metallic member of high thermal conductivity attached to and projecting from the opposite surface of said base plate, said metallic member having a surface upon which at least one electrical component can be easily mounted for support thereon and so accessible that leads or contacts may be readily affixed thereto, and the component has intimate contact therewith over a substantial surface area so that heat may flow readily from the electrical component through the metallic member and is carried to the base plate, whereby, the electrical component may be cooled when current flows through said thermoelectric junction to effect cooling thereat.

Figure 1:
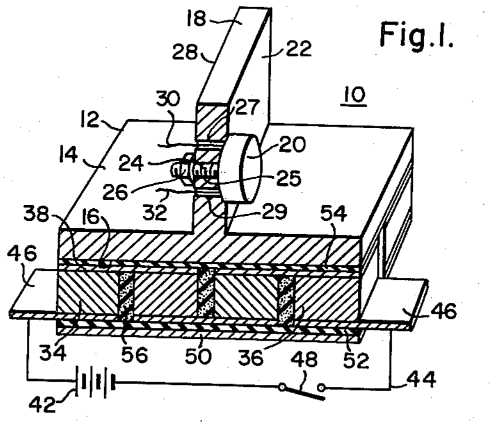
FIGURES 1 through 2 are perspective views partially in cross-section of thermoelectrical cooling devices suitable for use in accordance with the teachings of this invention.

More specifically with reference to FIG. 1, there is illustrated one possible configuration of a thermoelectric cooling device 10 embodying the teachings of this invention. The device 10 is comprised of a base plate 12 which may be of square, rectangular, round, elliptical or any other suitable configuration. The base plate 12 is comprised of a metal having a high thermal conductivity, for example, copper, aluminum, steels of the non-stainless variety and the like. The thickness of the base should be sufficient to provide a low thermal gradient from any point to any other point. The base plate has a top surface 14 and a bottom surface 16.

A metallic projecting member 18 comprised of a metal having a high thermal conductivity for example, silver, copper, steels of the non-stainless variety and the like projects vertically from the top surface 14 of the base plate 12. The upper part metallic member may be of any geometric configuration which is compatible with the configuration of the base plate 12, for example, square, cornered or rounded, and it need not be perpendicular to base 12, but may be at some other angle thereto. The projecting member 18 must be sufficiently large to accommodate the desired electrical component. In FIG. 1, the metallic member 18 is illustrated as extending entirely across the width of the base plate 12 at substantially the midpoint of the base plate 12. The position of the metallic member 18, relative to the base plate 12, may be varied as will be discussed hereinafter. Most appropriately the projecting member 18 and base 12 are integral—being comprised of an extrusion of copper, brass or aluminum.

In FIG. 1, the metallic member 18 is illustrated supporting a two-terminal type semiconductor device sealed in a container 20. The container 20 is held in intimate contact with a substantial area of surface 22 of the metallic member 18. A stud 24 extends from the container 20, through an aperture 25 in the metallic member 18 and the container is held in the firm contact with the surface 22 of the metallic member 18 by means of a nut 26 or other suitable locking device. Contact or lead wires 30 and 32 connected to the semiconductor device pass from the container 20 and thence through apertures 27 and 29 in the metallic member 18 to a power source or other electrical apparatus (not shown).

It will be understood that while a two-terminal semiconductor device is illustrated in FIG. 1, three or more terminal devices may be supported in the same manner.

At least one pair and preferably a plurality of pairs of thermoelectric elements are disposed in thermal contact with the bottom surface 16 of the base plate 12. Each pair of thermoelectric elements is comprised of a p-type thermoelectric pellet 34 and an n-type pellet 36. Examples of suitable p-type pellet materials include: bismuth telluride (suitably doped), zinc antimonide, lithium nickel oxide, manganese silicate, lithium manganese selenide. Examples of n-type thermoelectric materials include: indium antimonide, bismuth telluride (suitably doped), indium arsenide sulfide, titanium oxide, bismuth tellurium selenide. Each p-type element 34 and n-type element 36, one each of which comprise a pair of elements, are connected at one end by an electrical conductor 38 for example, copper, silver and the like which is generally in the form of a strip or a plate. The elements may be joined to the conductor 38 by soldering, brazing or the like. Each pair of elements is connected by an electrical conductor 40 of copper, or the like disposed at the opposite end of the elements between an n-type member and one pair and a p-type member of another pair. The elements are joined to the conductor 40 by soldering, brazing or the like.

The pairs of pellets 34 and 36 are connected in circuit with a direct current source 42, for example, a battery, by a conductor 44 and terminals 46. A switch 48 is interposed in the conductor 44 to enable the electrical current to be opened and closed as desired.

When the switch 48 is closed, current flows through the conductor 44 and contacts 46 to the pellets 34 and 36 and as a result of the Peltier Effect cooling is effected along the junction between the pellets and conductor 38 and heating occurs at the hot junction between the pellets and conductor 40. A metal strip or plate 50 comprised of for example, silver, copper or any other metal having a high thermal conductivity may be disposed along the hot junction to facilitate dissipation of the heat therefrom to the ambient or a cooling liquid. It may comprise fins or other extended surface. A layer 52 of an electrical insulating material is disposed between the contact 40 and terminals 46 and the strip 50 to prevent short-circuiting of the current through the strip 50. A layer of electrical insulation 54, for example, mica, is disposed between contact 38 and the bottom surface 16 of the base plate 12 to prevent short-circuiting of the current through the base plate 12.

A layer of thermal insulating material 56 in the form of, for example, a foamed resin glass fiber and powdered silica, may be disposed between the cold junction and the hot junction of the thermoelectric elements to reduce external flow of heat therebetween.

The pairs of thermoelectric pellets may be connected either in series or in parallel. When the power source 42 is a high voltage source, the pairs of thermoelectric pellets are connected in series. When the power source 42 has a sufficiently low voltage, the best results may be achieved when the pairs of thermoelectric pellets are connected in parallel.

In operation, as the electrical componnet or semiconductor device contained within the container 20 operates, heat is generated. A rise of temperature will occur and beyond a certain point will be adverse in that the efficiency and effective operation may be degraded. This heat passes from the container 20 to the metallic member 18 and thence to the base plate 12. A low thermal gradient exist because of the close contact between the container 20 with the heavy metal member 18 and base plate 12. The switch 48 is closed causing a current to flow from the power source 42 through the pellets 34 and 36 whereby due to the Peltier Effect, cooling is accomplished along the metallic strip 38. The heat which has passed from the electrical component to the base plate is then absorbed at the cold junction. This heat as well as the heat resulting from the operation of the thermoelectric elements is dissipated to the ambient air through the metal strip 50.

Figure 2:
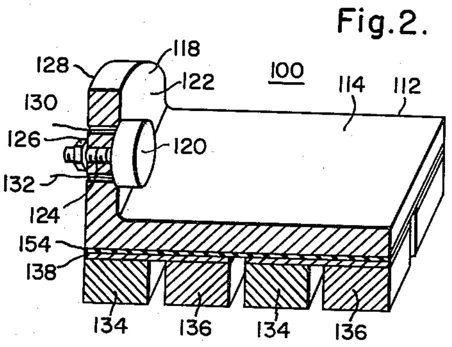

With reference to FIG. 2, there is illustrated a second configuration of a thermoelectric cooling device 100 embodying the teachings of this invention. The heat dissipating means and current source and the like are similar to that in FIG. 1. The device 100 is comprised of a base plate 112 which may be square, rectangular, round, elliptical or any other suitable configuration. The base plate 112 is comprised of a metal having a high thermal conductivity for example, copper, aluminum, steels of the non-stainless variety and the like. The base plate 112 has a top surface 114 and a bottom surface 116.

A metallic member 118 comprised of the same metal as the base plate or a similar metal having a high thermal conductivity projects vertically from one edge of the top surface 114 of the base plate 112. In FIG. 2, the metallic member 118 is illustrated as substantially semi-circular in configuration. The metallic member 118 extends substantially across the entire width of the base plate 112.

A semiconductor device is disposed within a container 120 held in intimate contact with a substantial area of surface 122 of the metallic member 118 by means of a stud 124 and a nut 126 in the same manner as that set forth above in the description of FIG. 1. Electrical leads 130 and 132 extend from the semiconductor device within the container 120 and through apertures in the metallic member 118. The leads 130 and 132 are used to connect the semiconductor device within the case 120 to other electrical apparatus (not shown).

As in FIG. 1, p-type thermoelectric pellets 134 and n-type pellets 136 are connected in pairs to effect the cooling of the base plate 112 through a cold junction established at the junction of one end of the pellets and a metal strip 138. The thermoelectric pellets are insulated from the base plate by a layer of electrical insulation 154.

The remainder of the structure of FIG. 2 is similar to that of FIG. 1 and the operation of the thermoelectric device illustrated in FIG. 2 is the same as that described for the thermoelectric device illustrated in FIG. 1.

Figure 3:
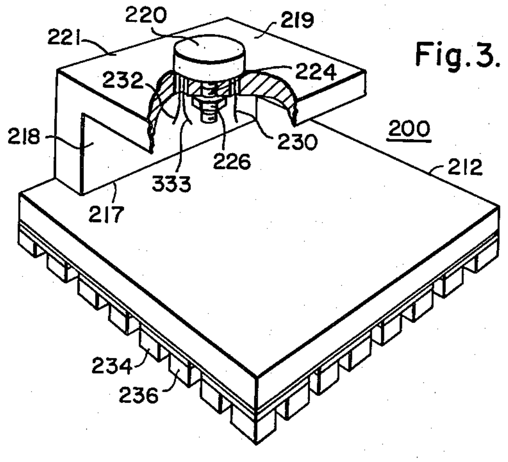
FIGS. 3 and 4 are perspective views partly in broken section of modifications of the device of FIG. 1.

With reference to FIG. 3, there is shown a third modification of a thermoelectric cooling device suitable for use in accordance with the teachings of this invention. This is a fragmentary portion, of which the lower part, not shown, is similar to FIG. 1. The device 200 is comprised of a base plate 212. A metallic member 218 projects vertically from one edge of the base plate 212. The vertical projection 218 is centrally disposed along edge 217 of the base plate. The metallic member 218 has an over-hanging portion 219 forming a horizontally disposed surface projecting therefrom. Metallic member 218 and over-hanging portion 219 combine to form an L-shaped member. An electrical or electronic component within a case 220 is held in intimate contact with surface 221 of the over-hanging portion 219 by the use of a stud 224 and a nut 226 in the manner described above. Three electrical leads 230, 232 and 233 pass from the electrical or electronic component through the container 220 and through apertures in the over-hanging portion 219. The contacts or leads 230, 232 and 233 may be used to effect connection between the electrical or electronic component contained within the container 220 and other electrical apparatus not shown. It will be apparent that over-hanging portion 219 is highly accessible and renders it easy to mount devices and to attach leads thereto. The base plate 212 is cooled by thermoelectric pellets 234 and 236 in the manner described above in connection with FIG. 1. The operation of the device 200 is substantially identical to that set forth above in that heat generated within the electrical or electronic component passes to the case 212 and in turn to the over-hanging portion 219, to the vertical member 218 and thence to the base plate 212 where it is absorbed as a result of thermoelectric cooling.

Figure 4:
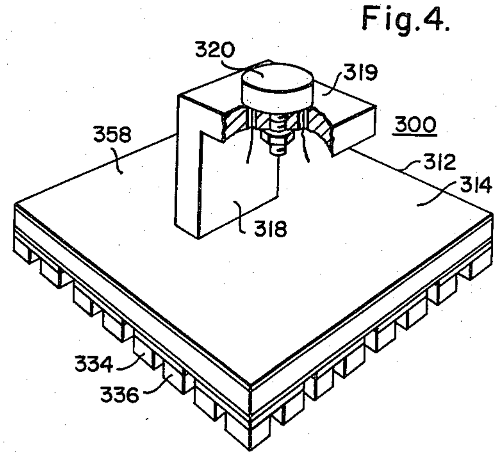

With reference to FIG. 4, there is illustrated still another modification of the thermoelectric cooling device of this invention. The device 300 comprises a base plate 312. A metallic member 318 projects vertically from the central portion of top surface 314 of the base plate 312. The metallic member 318 has an over-hanging substantially horizontal portion 319 which is adapted to receive an electrical or electronic component in the manner described above. Surface 314 of the base plate 312 is covered with a thin sheet 358 of a thermal insulating material for example, a foamed resin or a fabric layer. The operation of the thermoelectric device 300 is substantially the same as that described above. Heat generated within the electrical or electronic component passes to the case 320 thence, to the over-hanging portion 319, to the metallic member 318 and to the base plate 312. By the use of p- and n-type thermoelectric elements 334 and 336, respectively, the base plate is cooled by the Peltier Effect and the heat generated by the operation of the electrical component and by the thermoelectric pellets themselves is dissipated to the ambient atmosphere in the manner described above in connection with FIG. 1.

Figure 5:
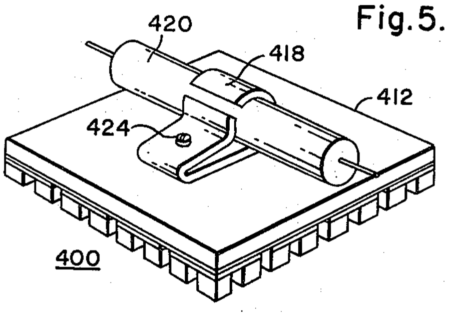
FIG. 5 is a perspective view.

With reference to FIG. 5, there is illustrated a thermoelectric cooling device 400 in which a clip 418, preferably resilient, is in intimate contact with a base plate 412. The resilient or spring clip 418 may be secured to the base plate 412 by the use of a screw 424 or by any other suitable means. An electronic or electrical component contained within a case 420 is secured within and embraced by the spring clip 418. A substantial contact area between clip 418 and case 420 is provided. In operation, heat generated from the electrical or electronic component passes to the spring clip 418 and thence to the base plate 412. The heat thus conducted to the base plate is dissipated by thermoelectric cooling effected in accordance with the Peltier Effect by p- and n-type thermoelectric pellets 434 and 436 respectively.

Figure 6:
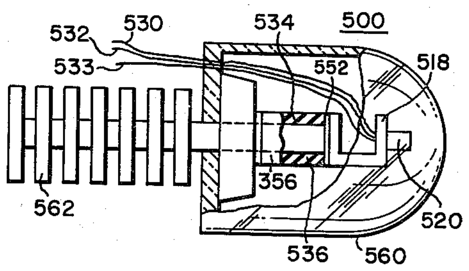
FIG. 6 is a side view partially in cross-section of a thermoelectric cooling device suitable for use in accordance with the teachings of this invention.

With reference to FIG. 6, there is illustrated still another modification of the thermoelectric device of this invention. In the device 500, an electrical component contained within a container 520 is held in intimate contact with one leg of a U-shaped metallic member 518. The other leg of the U-shaped member 518 is in thermal contact with a pair of thermoelectric elements comprised of a p-type element 534 and an n-type element 536. The thermoelectric elements 534 and 536 are insulated from the U-shaped metallic member by a layer of electrical insulation 552. The entire electronic component and thermoelectric element are enclosed within a glass enclosure 560 which is evacuated to protect the electronic component and the thermoelectric elements from the atmosphere and to prevent loss of cooling to the atmosphere. Three electrical leads 530, 532, and 533 extend from the electrical component through the case 520, through the metallic bar 518 and through the glass enclosure 560 and may be used to facilitate connecting the electrical or electronic component to other electrical apparatus not shown. In the operation of the device 500, heat from the electrical or electronic component and from the operation of the thermoelectric elements is dissipated to the ambient atmosphere by the use of cooling fins 562. The fins 562 may be cooled by passing water or air thereover.

The electrical components can be semiconductor rectifiers, transistors, capacitors and other devices.

While the invention has been described with reference to the particular embodiments it will be understood that modifications, substitutions and the like may be made therein without departing from its scope.

We claim as our invention:

1. A thermoelectric device capable of supporting and effectively cooling an electrical component comprising, a base plate, said base plate being comprised of a metal having a high thermal conductivity, at least one pair of thermoelectric elements having a junction in thermal conductive contact with one surface of said base plate, said thermoelectric elements being wholly electrically insulated from said base plate, a metallic member having a high thermal conductivity projecting from the opposite surfaces of said base plate, said member having a surface upon which at least one electrical component can be mounted for support in a readily accessible position and for intimate contact therewith so that heat may flow from the electrical component to the metallic member and thence to the base plate, whereby, the electrical component may be cooled when current flows through said thermoelectric junction to effect cooling thereat, said thermoelectric elements and said electrical component being electrically insulated from each other, and constructed and arranged so that both are capable of being energized by separate electrical means.

2. A thermoelectric member capable of supporting and effectively cooling an electrical component comprising, a base plate, said base plate being comprised of a metal having a high thermal conductivity, at least one pair of thermoelectric elements having a hot and a cold junction, said cold junction being in thermal conductive contact with one surface of said base plate, said thermoelectric elements being wholly electrically insulated from said base plate, a thermal insulating material disposed about said thermoelectric elements thermally insulating said base plate from said hot junction, a metallic member having a high thermal conductivity projecting from the opposite surface of said base plate, said metallic member having a surface upon which at least one electrical component can be mounted for support and for intimate contact therewith so that heat may flow from the electrical component to the metallic member and thence to the base plate, whereby, the electrical component may be cooled when current flows through said thermoelectric junction to effect cooling thereat, said thermoelectric elements and said electrical component being electrically insulated from each other, and constructed and arranged so that both are capable of being energized by separate electrical means.

3. A thermoelectric member capable of supporting and efficiently cooling an electrical component comprising, a base plate, said base plate being comprised of a metal having a high thermal conductivity, at least one pair of thermoelectric elements having a hot and a cold junction, said cold junction being in thermal conductive contact with one surface of said base plate, said thermoelectric elements being electrically insulated from said base plate, a thermal insulating material disposed about said thermoelectric elements thermally insulating said base plate from said hot junction, a metallic member having a high thermal conductivity joined to the opposite surface of said base plate, said member being joined to said base plate at substantially the midpoint of the base plate and extending across the width of the base plate, said member having a surface upon which at least one electrical component can be mounted for support and for intimate contact therewith so that heat may flow from the electrical component to the metallic member and thence to the base plate, whereby, the electrical component may be cooled when current flows through said thermoelectric junction to effect cooling thereat.

4. The thermoelectric member of claim 3, wherein metallic member comprises apertures for mounting the electronic component and for the passage of electrical leads therethrough.

5. A thermoelectric member capable of supporting and efficiently cooling an electrical component comprising, a base plate, said base plate being comprised of a metal having a high thermal conductivity, at least one pair of thermoelectric elements having a hot and a cold junction, said cold junction being in thermal conductive contact with one surface of said base plate, said thermoelectric elements being wholly electrically insulated from said base plate, a thermal insulating material disposed about said thermoelectric elements thermally insulating said base plate from said hot junction, a metallic member having a high thermal conductivity joined to the opposite surface of said base plate, said member being joined to said base plate at one end thereof, said member having a surface upon which at least one electrical component can be mounted for support and for intimate contact therewith so that heat may flow from the electrical component to the metallic member and thence to the base plate, whereby, the electrical component may be cooled when current flows through said thermoelectric junction to effect cooling thereat, said thermoelectric elements and said electrical component being electrically insulated from each other, and constructed and arranged so that both are capable of being energized by separate electrical means.

6. The thermoelectric member of claim 5, wherein the metallic member comprises apertures for mounting the electrical component and for the passage of electrical leads therethrough.

7. A thermoelectric member capable of supporting and efficiently cooling an electrical component comprising, a base plate, said base plate being comprised of a metal having a high thermal conductivity, at least one pair of thermoelectric elements having a hot and a cold junction, said cold junction being in thermal conductive contact with one surface of said base plate, said thermoelectric elements being electrically insulated from said base plate, a thermal insulating material disposed about said thermoelectric elements thermally insulating said base plate from said hot junction, a metallic member having a high thermal conductivity projecting from the middle of the opposite surface of said base plate, said member having a surface upon which at least one electrical component can be mounted for support and for intimate contact therewith so that heat may flow from the electrical component to the metallic member and thence to the base plate, whereby, the electrical component may be cooled when current flows through said thermoelectric junction to effect cooling thereat.

8. The thermoelectric member of claim 7, wherein the metallic member comprises apertures for mounting the electronic component and for the passing of electrical leads therethrough.

9. A thermoelectric member capable of supporting and efficiently cooling an electrical component comprising, a base plate, said base plate being comprised of a metal having a high thermal conductivity, at least one pair of thermoelectric elements having a hot and a cold junction, said cold junction being in thermal conductive contact with one surface of said base plate, said thermoelectric elements being electrically insulated from said base plate, a thermal insulation material disposed about said thermoelectric elements thermally insulating said base plate from said hot junction, an L-shaped metallic member having a high thermal conductivity projecting vertically from the upper surface of said base, the horizontal portion of said metallic member having a surface upon which at least one electrical component can be mounted for support and for intimate contact therewith so that heat may flow from the electrical component to the metallic member and thence to the base plate, whereby, the electrical component may be cooled when current flows through said thermoelectric junction to effect cooling thereat.

10. Thermoelectric member of claim 9, wherein the horizontal portion of the vertically extending L-shaped member comprises apertures for mounting the electrical component and for passage of the electrical leads therethrough.

11. A thermoelectric member capable of supporting and efficiently cooling an electrical component comprising a base plate, said base plate being comprised of a metal having a high thermal conductivity, at least one pair of thermoelectric elements having a hot and a cold junction, said cold junction being in thermal conductive contact with one surface of said base plate, said thermoelectric elements being electrically insulated from said base plate, a thermal insulation material disposed about said thermoelectric elements thermally insulating said base plate from said hot junction, a metallic clip projecting from the opposite surface of said base plate, said metallic clip being capable of receiving and holding intimate contact therewith at least one electrical component so that heat may flow from the electrical component to the metallic clip and thence to the base plate, whereby, the electrical component may be cooled when current flows through said thermoelectric junction to effect cooling thereat.

12. A thermoelectric member capable of supporting and efficiently cooling an electrical component comprising a base plate, said base plate being comprised of a metal having a high thermal conductivity, at least one pair of thermoelectric elements having a hot and a cold junction, said cold junction being in thermal conductive contact with one surface of said base plate, said thermoelectric elements being wholly electrically insulative from said base plate, a thermal insulating material disposed about said thermoelectric elements thermally insulating said base plate from said hot junction, a metallic member having a high thermal conductivity projecting from the opposite surface of said plate, an electrical component in intimate contact with one surface of said metallic member so that heat flows from the electrical component to the metallic member and thence to the base plate, whereby, the electrical component is cooled when current flows through said thermoelectric junction to effect cooling thereat, said thermoelectric elements and said electrical component being electrically insulated from each other, and constructed and arranged so that both are capable of being energized by separate electrical means.

13. A thermoelectric member capable of supporting and efficiently cooling an electrical component comprising, a base plate, said base plate being comprised of a metal having a high thermal conductivity, at least one pair of thermoelectric elements having a hot and a cold junction, said cold junction being in thermal conductive contact with one surface of said base plate, said thermoelectric elements being electrically insulated from said base plate, a thermal insulating material disposed about said thermoelectric elements thermally insulating said base plate from said hot junction, a metallic member having a high thermal conductivity projecting from substantially the midpoint of the opposite surface of said base plate, said metallic member extending across the width of the base plate, an electrical component in intimate contact with one surface of said metallic member so that heat flows from the electrical component to the metallic member and thence to the base plate, whereby, the electrical component is cooled when current flows through said thermoelectric junction to effect cooling thereat.

14. A thermoelectric member capable of supporting and efficiently cooling an electrical component comprising, a base plate, said base plate being comprised of a metal having a high thermal conductivity, at least one pair of thermoelectric elements having a hot and a cold junction, said cold junction being in thermal conductive contact with one surface of said base plate, said thermoelectric elements being electrically insulated from said base plate, a thermal insulating material disposed about said thermoelectric elements thermally insulating said base plate from said hot junction, a metallic member having a high thermal conductivity projecting from one end of the opposite surface of said base plate, an electrical component in intimate contact with one surface of said metallic member so that heat flows from the electrical component to the metallic member and thence through the base plate, whereby, the electrical component is cool when current flows through said thermoelectric junction to effect cooling thereat.

15. A thermoelectric member capable of supporting and efficiently cooling an electrical component comprising, a base plate, said base plate being comprised of a metal having a high thermal conductivity, at least one pair of thermoelectric elements having a hot and a cold junction, said cold junction being in thermal conductive contact with one surface of said base plate, said thermoelectric elements being electrically insulative from said base plate, a thermal insulating material disposed about said thermoelectric elements thermally insulating said base plate from said hot junction, a metallic member having a high thermal conductivity projecting from substantially the midpoint of said base plate, an electrical component in intimate contact with one surface of said metallic member so that heat flows from the electrical component to the metallic member and thence to the base plate, whereby, the electrical component is cool when current flows through said thermoelectric junction to effect cooling thereat.

16. A thermoelectric member capable of supporting and efficiently cooling an electrical component comprising, a base plate, said base plate being comprised of a metal having a high thermal conductivity, at least one pair of thermoelectric elements having a hot and a cold junction, said cold junction being in thermal conductive contact with one surface of said base plate, said thermoelectric elements being substantially insulative from said base plate, a thermal insulating material disposed about said thermoelectric elements thermally insulating said base plate from said hot junction, an L-shaped metallic member having a high thermal conductivity projecting vertically from the opposite surface of said base plate, an electrical component in intimate contact with one surface of the horizontal portion of said metallic member so that heat flows from the electrical component to the metallic member and thence to the base plate, whereby, the electrical component is cooled when current flows through said thermoelectric junction to effect cooling thereat.

17. A thermoelectric member capable of supporting and efficiently cooling an electrical component comprising, a base plate, said base plate being comprised of a metal having a high thermal conductivity, at least one pair of thermoelectric elements having a hot and a cold junction, said cold junction being in thermal conductive contact with one surface of said base plate, said thermoelectric elements being electrically insulative from said base plate, a thermal insulating material disposed about said thermoelectric elements thermally insulating said base plate from said hot junction, a metallic clip having a high thermal conductivity joined to the opposite surface of said base plate, an electrical component in intimate contact with said clip member so that heat flows from the electrical component to the clip member and thence to the base plate, whereby, the electrical component is cooled when current flows through said thermoelectric junction to effect cooling thereat.

References Cited in the file of this patent

UNITED STATES PATENTS

| | | |
|---|---|---|
| 2,777,975 | Aigrain | Jan. 15, 1957 |
| 2,783,418 | Peter | Feb. 26, 1957 |
| 2,809,004 | Kaufman | Oct. 8, 1957 |
| 2,815,472 | Jackson | Dec. 3, 1957 |
| 2,844,638 | Lindenblad | July 22, 1958 |
| 2,862,159 | Walworth | Nov. 25, 1958 |
| 2,912,624 | Wagner | Nov. 10, 1959 |